United States Patent [19]

Duncan et al.

[11] Patent Number: 5,098,287
[45] Date of Patent: Mar. 24, 1992

[54] LID FOR IMPROVED DENDRITIC WEB GROWTH

[75] Inventors: Charles S. Duncan, Penn Hills; Edgar L. Kochka, Greentree; Paul A. Piotrowski, Monroeville; Raymond G. Seidensticker, Forest Hills, all of Pa.

[73] Assignee: Westinghouse Electric Corp., Pittsburgh, Pa.

[21] Appl. No.: 525,205

[22] Filed: Mar. 16, 1990

Related U.S. Application Data

[63] Continuation of Ser. No. 943,092, Dec. 18, 1986, abandoned.

[51] Int. Cl.[5] .............................................. F27B 14/10
[52] U.S. Cl. ..................................... 432/262; 432/263
[58] Field of Search ................ 432/262, 263, 253, 254

[56] References Cited

U.S. PATENT DOCUMENTS

| | | | |
|---|---|---|---|
| 1,838,357 | 12/1931 | Bottrill | 432/263 |
| 4,208,043 | 6/1980 | Sieurin | 432/262 |
| 4,303,615 | 12/1981 | Jarmell et al. | 432/262 |

OTHER PUBLICATIONS

*Silicon Ribbon Growth by the Dendritic Web Process,* by R. G. Seidensticker et al. at pp. 221-235 of Journal of Crystal Growth 50 (1980).

*Primary Examiner*—Henry C. Yuen
*Attorney, Agent, or Firm*—Fred J. Baehr, Jr.

[57] ABSTRACT

A lid for a susceptor in which a crystalline material is melted by induction heating to form a pool or melt of molten material from which a dendritic web of essentially a single crystal of the material is pulled through an elongated slot in the lid and the lid has a pair of generally round openings adjacent the ends of the slot and a groove extends between each opening and the end of the slot. The grooves extend from the outboard surface of the lid to adjacent the inboard surface providing a strip contiguous with the inboard surface of the lid to produce generally uniform radiational heat loss across the width of the dendritic web adjacent the inboard surface of the lid to reduce thermal stresses in the web and facilitate the growth of wider webs at a greater withdrawal rate.

1 Claim, 4 Drawing Sheets

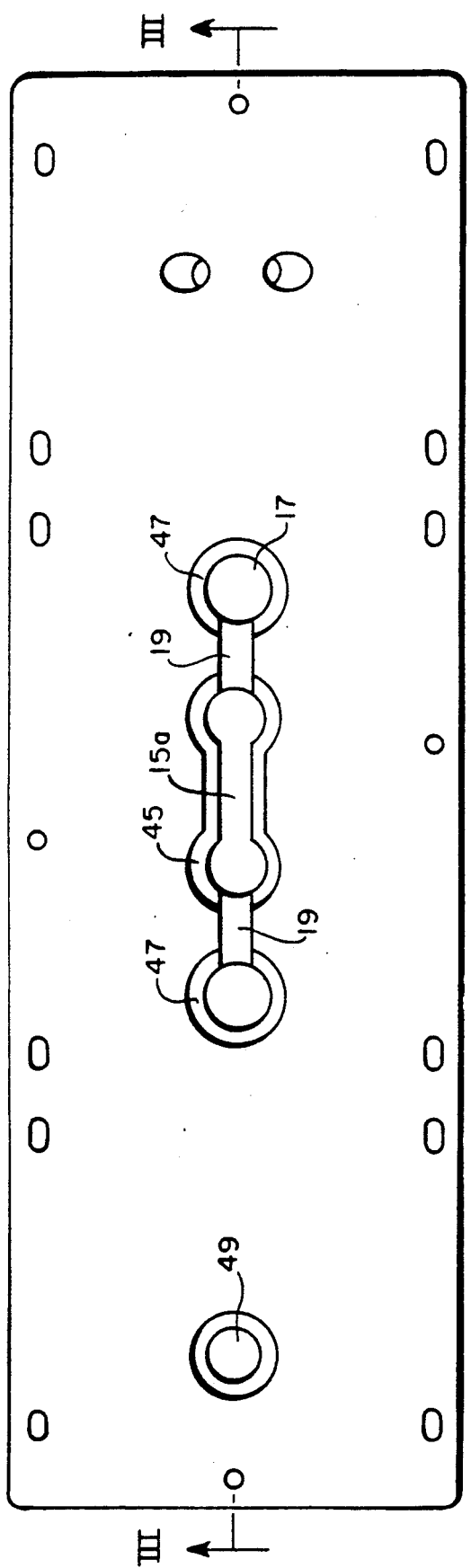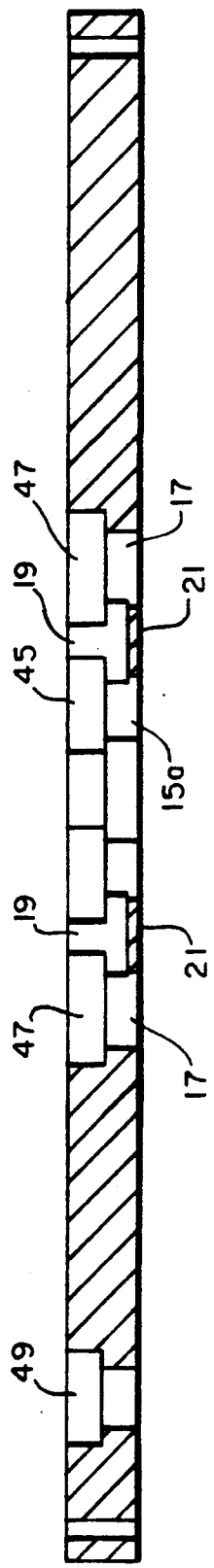
FIG. 4
FIG. 5

LID FOR IMPROVED DENDRITIC WEB GROWTH

This application is a continuation of application Ser. No. 06/943,092 filed Dec. 18, 1986, now abandoned.

BACKGROUND OF THE INVENTION

This invention relates to single crystal dendritic webs and more particularly to a susceptor lid which enhances the thermal environment of the web adjacent the lid.

Forming a ribbon crystal by dendritic web growth is controlled by crystallography and surface tension force rather than the shape defining dyes. Ribbons of indium antimonide, gallium arsenide, germanium and silicon and other crystalline materials may be produced by providing a liquid pool of the crystalline material and placing a dendritic seed of the crystalline material which is supercooled a few degrees into the molten pool and as the temperature in the pool falls, the seed first spreads laterally to form a button. The seed is then raised causing two secondary dendritic boundaries to propagate from each end of the button and extend into the pool The button and dendritics form a frame which support a liquid film of the molten material which crystallizes to form a web generally 0.1 to 0.2 mm. thick. The web and bordering dendritics can theoretically be propagated indefinitely be replenishing the liquid pool as the dendritic ribbon is pulled from the pool. The ribbon width and growth velocity are determined by the thermal conditions in the melted pool and the environment adjacent the emerging dendritic ribbon. For a more detailed description of the dendritic web formation, reference may be made to an article by R. G. Seidensticker (one of the inventors) and R. H. Hopkins, entitled, "Silicon Ribbon Growth by the Dendritic Web Process", publishes in the Journal of Crystal Growth, Vol. 50, 1980, pages 221 to 235.

SUMMARY OF THE INVENTION

In general, a lid for a susceptor in which a crystalline material is melted, when made in accordance with this invention, comprises a lid made in the form of a plate having an inboard side and an outboard side and a centrally disposed slot through which a dendritic web of essentially a single crystal of the material is pulled. A pair of openings are aligned with and disposed adjacent opposite ends of the slot and a groove extends between the slot and each opening and also extends inwardly from the outboard side of the lid to adjacent the inboard side thereof. The slot opening and grooves cooperate to control the radiation of heat from the dendritic web to produce a generally uniform temperature distribution across the dendritic web adjacent the inboard side of the lid.

BRIEF DESCRIPTION OF THE DRAWINGS

The objects and advantages of this invention will become more apparent by reading the following detailed description in conjunction with the accompanying drawings, in which:

FIG. 4 is a plan view of a lid for a susceptor made in accordance with this invention;

FIG. 5 is a sectional view taken on line III—III of FIG. 2;

DESCRIPTION OF THE PREFERRED EMBODIMENT

Figure 1:
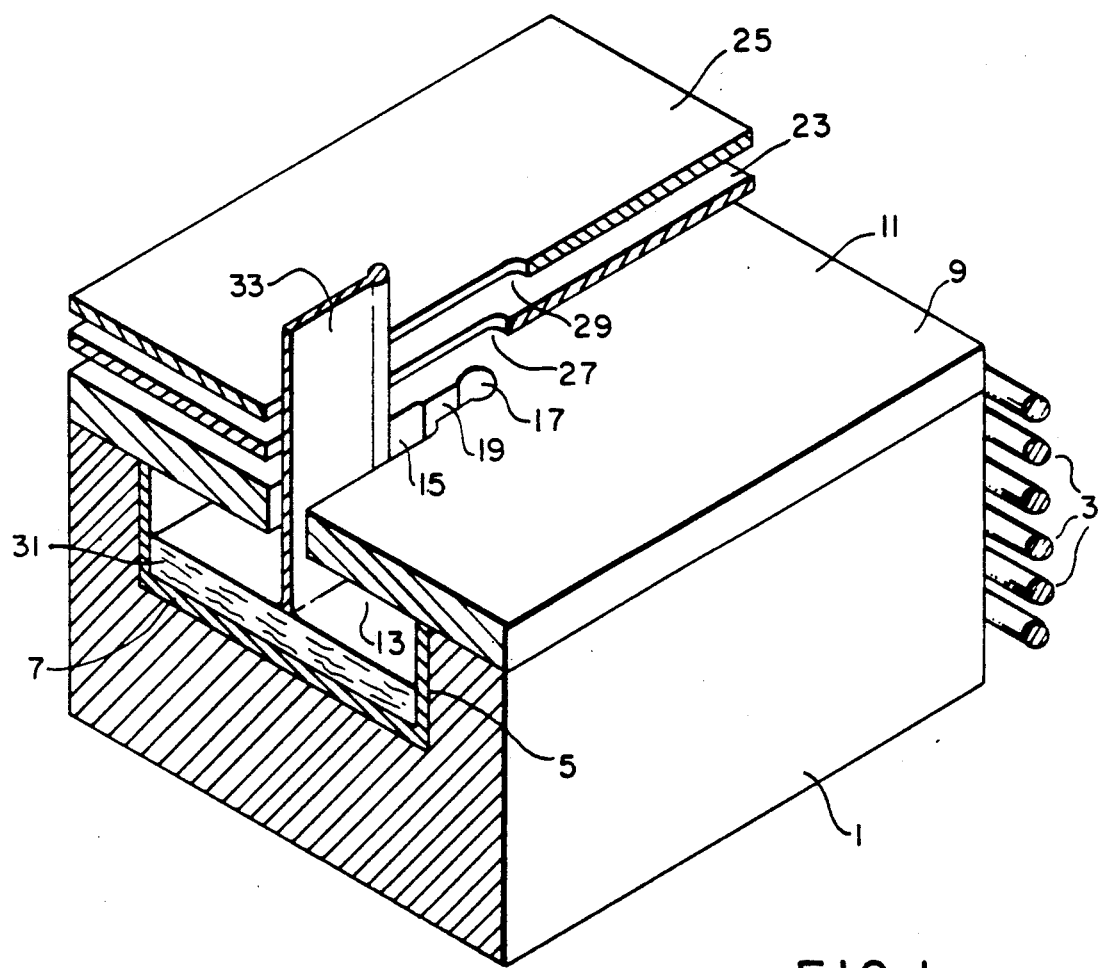
FIG. 1 is a partial isometric view of a lid for a susceptor utilized to form a molten pool of silicon from which essentially a single crystal dendritic web is withdrawn.

Referring now to the drawings in detail and in particular to FIG. 1, there is shown a susceptor 1 made of molybdenum or other material which is heated by an induction coil 3. Centrally disposed in the susceptor 1 is a cavity 5 in which is disposed a quartz crucible 7 which lines the cavity 5 of the susceptor 1. A lid 9 formed from a flat plate of molybdenum covers the crucible 7. The lid has a generally flat outboard and inboard surface 11 and 13, respectively, and a centrally disposed slot 15 extending therethrough. Aligned with the slot 15 and disposed adjacent each end thereof is an opening 17 which extends through the lid 9 and has a generally round cross-section. A groove 19 extends between and into the slot 15 and each opening 17. The groove 19 extends into the lid 9 from the outboard side 11 to adjacent the inboard side 13 leaving a thin strip 21 on the inboard side of the groove 19. A plurality of heat shield sheets 23 and 25 are disposed adjacent the outboard side of the lid 9 each heat shield sheet has a slot 27 and 29, respectively, which registers with the slot 15 and opening 17 in the lid 9. Each of the slots 27 and 29 is wider and longer than the slot 15 and opening 17 and the outboard slot 29 is wider and longer than the inboard slot 27.

A pool or melt 31 of silicon or other crystalline material is formed in the crucible 7 and essentially a single crystal dendritic web 33 of silicon or other crystalline material is pulled or withdrawn from the melt 31.

Figure 2:
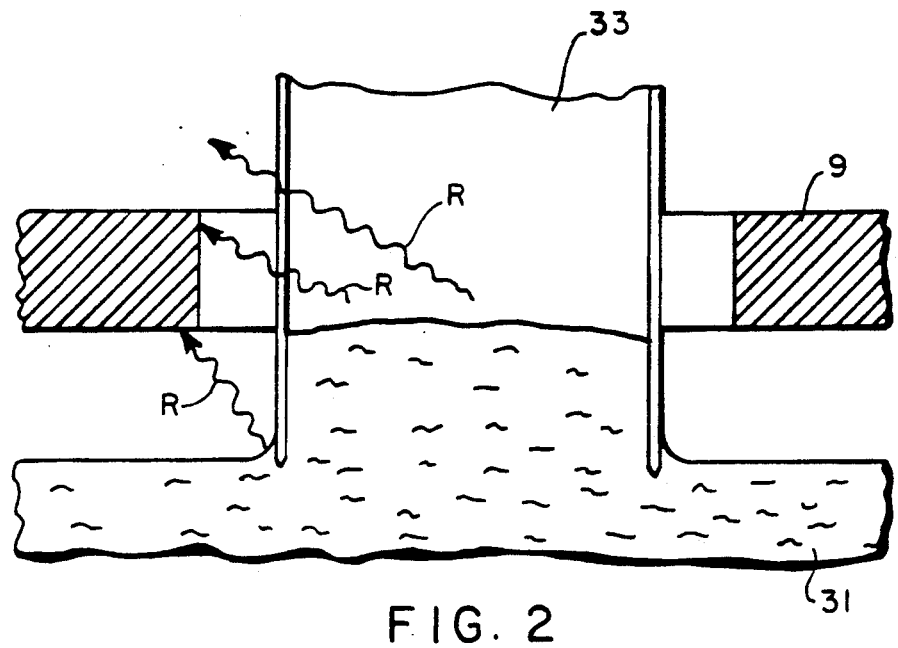
FIGS. 2 and 3 are schematic views showing heat radiation losses from the pool and dendritic webs.
Figure 3:
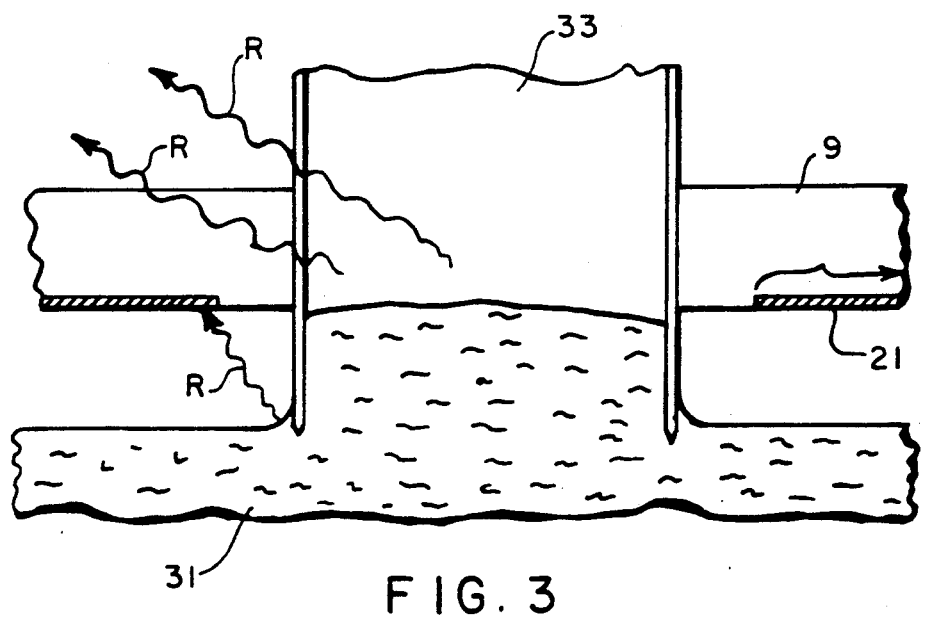

As shown in FIGS. 2 and 3, the radiation heat loss from the dendritic web 33 is different when there is a groove 19 than when there is no groove. The groove 19 in this susceptor lid 9 provides a view from the edge of the growing web 33 that is substantially the same as the view of the surrounding area from the central portion of the web 33. Because the groove 19 does not penetrate completely through the lid 9, but leaves the strip 21, the heat loss from the melt 31 is controlled in nearly the same manner as the lid 9 without the groove shown in FIG. 2. However, once the dendritic web crystal 33 is slightly above the inboard side of the lid 9, the slot 15 is essentially much larger in FIG. 3. In FIG. 2, the heat radiation from the melt is intercepted by the inboard side 13 of the lid 9 while the heat radiation from the web 33 near the end of the slot 15 is intercepted by the vertical wall portion 35 of the slot 15. Thus, the heat loss is non-uniform across the width of the web and in fact, will lead to an isotherm distribution across the web 33 which is smiling or turned upwardly adjacent the edges. This results in high thermal stresses in the web whereas as shown in FIG. 3, when the grooves 19 are provided, the heat radiation from the melt 31 is intercepted by the strip 21 the same as shown in FIG. 2, however, the radiation heat loss near the edge of the web 33 in the area adjacent the inboard side of the lid 9 is relatively constant across the entire width of the web due to the groove 19. This in turn leads to a generally flat distribution of isotherms across the width of the web 33 or one which is slightly turned downwardly on the ends, frowning, which results in reduced thermal stresses in the web 33. Because of the reduced thermal stresses in the web 33, the web 33 does not deform resulting in crystal growth which can produce a wider web which is thinner and can be withdrawn faster to substantially increase the allowable growth rate of the web 33.

Figure 6:
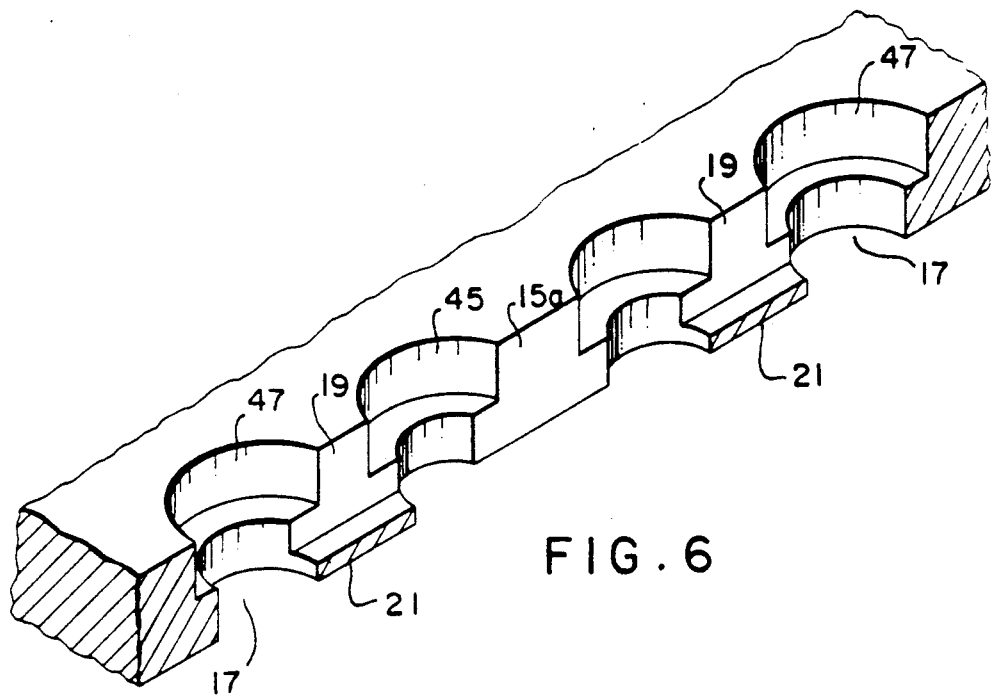
FIG. 6 is a partial isometric view of the slot openings and grooves shown in FIGS. 1 and 2.

FIGS. 4, 5 and 6 show the slot enlarged on the ends by circular openings 35 which form a dog-bone shaped slot 15a. The slot 15a and openings 17 are counterbored as indicated at 45 and 47, respectively, generally one-half the thickness of the lid 9. The counterbores 45 and 47 originate on the inboard side 11 of the lid 9. A feed port 49 through which additional silicon or other crystalline material is added to the melt pool 31 to make the process continuous is disposed adjacent at least one side of the lid 9. The grooves 19 are generally the same width as the slot 15a.

Figure 7:
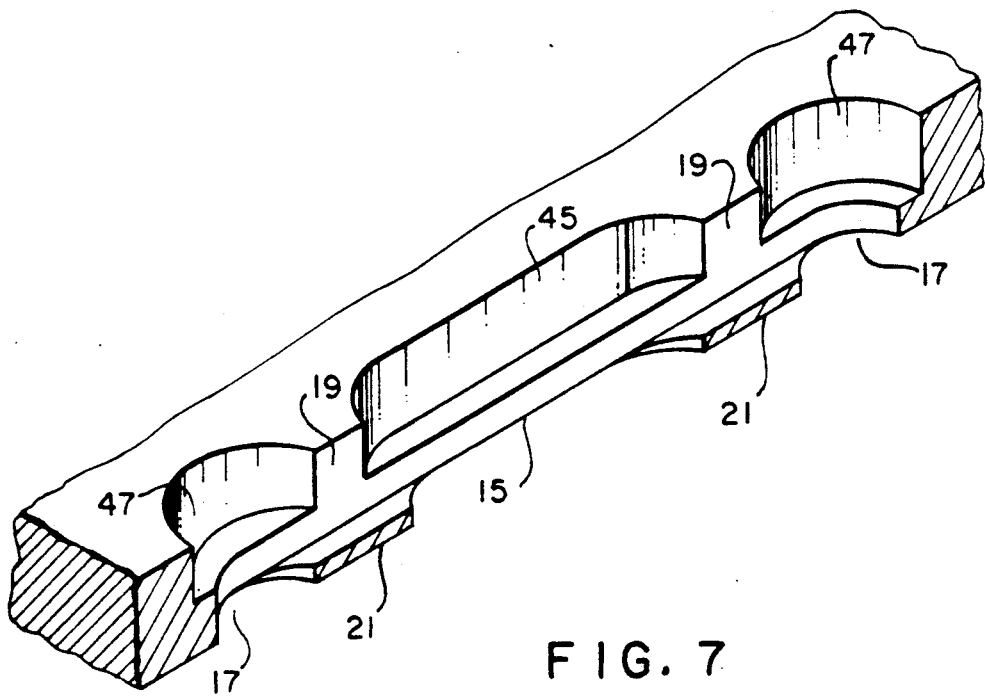
FIG. 7 is a partial isometric view of an alternative embodiment.

FIG. 7 shows the slot 15 and its counterbored portion 45, the opening 17 and their counterbored portion 47, the grooves 19 and the strips 21. The slot 15, opening 17, and grooves 19 merge into a single enlarged slot with the strips 21 sealing off portions of the inboard side of the lid inboard of the ends of the enlarged slot-like opening.

The slots 15 and 15a, opening 17 and grooves 19 cooperate to control the heat radiated from the web 33 adjacent the inboard side 13 of the lid 9 to produce a generally flat isotherm across the web 33 adjacent the inboard side 13 of the lid 9 which results in reduced stresses in the web 33 reducing the deformation in the crystalline growth which allows the production of a wider web at a higher pull rate to substantially increase the allowable growth rate of the dendritic web.

What is claimed is:

1. A lid for a susceptor in which a crystalline material is melted, said lid being in the form of a plate having an inboard side and an outboard side and a centrally disposed counter bored dog-bone shaped slot through which a dendritic web of essentially a single crystal of said material having a dendrite extending along each margin is pulled, a pair of counter bored openings aligned with and disposed outboard and spaced from opposite ends of said counter bored dog-bone shaped slot and a groove extending between said countered dog-bone shaped slot and each counter bored opening; said groove extending partially inwardly from the outboard side to adjacent the inboard side of said lid deeper than said counter bores forming a thin strip adjacent the inboard side of the lid, whereby said counter bored dog-bone shaped slot, said counter bored openings and said grooves cooperate to control the radiation of heat from said dendritic web by preventing heat from radiating from the margin dendrites and allowing heat energy to radiate from the central portion of the web to produce a generally flat distribution of isotherms across the width of the web adjacent the location where the material crystallizes adjacent the inboard side of said lid to produce a wider web, which can be pulled at a higher rate with substantially less defects in the web.

* * * * *